(12) United States Patent
Tokuda et al.

(10) Patent No.: US 11,823,717 B2
(45) Date of Patent: Nov. 21, 2023

(54) DISK DEVICE

(71) Applicants: Kabushiki Kaisha Toshiba, Tokyo (JP); Toshiba Electronic Devices & Storage Corporation, Tokyo (JP)

(72) Inventors: Kota Tokuda, Fujisawa Kanagawa (JP); Yoshihiro Amemiya, Chigasaki Kanagawa (JP); Shinra Yamanaka, Yokohama Kanagawa (JP); Nobuhiro Yamamoto, Yokohama Kanagawa (JP); Taichi Okano, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/689,873

(22) Filed: Mar. 8, 2022

(65) Prior Publication Data

US 2023/0062571 A1 Mar. 2, 2023

(30) Foreign Application Priority Data

Aug. 25, 2021 (JP) ................................. 2021-137351

(51) Int. Cl.
*G11B 33/12* (2006.01)
*H05K 1/05* (2006.01)
*H05K 1/11* (2006.01)
*G11B 5/54* (2006.01)

(52) U.S. Cl.
CPC ............. *G11B 33/122* (2013.01); *H05K 1/05* (2013.01); *H05K 1/118* (2013.01); *G11B 5/54* (2013.01)

(58) Field of Classification Search
None
See application file for complete search history.

(56) References Cited

U.S. PATENT DOCUMENTS

| | | | |
|---|---|---|---|
| 6,282,062 B1* | 8/2001 | Shiraishi | G11B 5/10 |
| 2003/0047534 A1* | 3/2003 | Takasugi | G11B 5/105 |
| 2006/0190673 A1* | 8/2006 | Arai | G11B 21/16 |
| 2007/0227768 A1* | 10/2007 | Shin | H05K 1/0281 |
| | | | 29/829 |
| 2009/0195935 A1* | 8/2009 | Choi | G11B 5/4853 |
| | | | 360/245.4 |
| 2016/0267927 A1* | 9/2016 | Kikuchi | G11B 5/483 |

FOREIGN PATENT DOCUMENTS

| | | |
|---|---|---|
| JP | 2010-192903 A | 9/2010 |
| JP | 2010-212439 A | 9/2010 |
| JP | 4825830 B2 | 11/2011 |

\* cited by examiner

*Primary Examiner* — William J Klimowicz
(74) *Attorney, Agent, or Firm* — Allen & Overy LLP

(57) ABSTRACT

A disk device according to one embodiment includes a magnetic disk, a magnetic head, and a flexible printed circuit board. The flexible printed circuit board is electrically connected to the magnetic head. The flexible printed circuit board includes a first layer, a second layer having conductive property, and a third layer having insulation property. The first layer includes a first surface having insulation property. The second layer overlays the first surface, and includes a first conductor and a second conductor spaced from the first conductor. The third layer covers at least a part of the first surface and at least a part of the second layer. The flexible printed circuit board is provided with a first hole that is located between the first conductor and the second conductor with spacing from the second layer and penetrates the third layer.

7 Claims, 8 Drawing Sheets

DISK DEVICE

CROSS-REFERENCE TO RELATED APPLICATIONS

This application is based upon and claims the benefit of priority from Japanese Patent Application No. 2021-137351, filed on Aug. 25, 2021; the entire contents of which are incorporated herein by reference.

FIELD

Embodiments described herein relate generally to a disk device.

BACKGROUND

In disk devices such as a hard disk drive, information is read and written from and to a magnetic disk with a magnetic head. Such a disk device includes, for example, a flexible printed circuit board that electrically connects a controller and the magnetic head. The flexible printed circuit board is provided with a plurality of conductors such as wiring and pads.

For example, along with improvement in the function of the disk device, the conductors may be mounted at a higher density on the flexible printed circuit board. In such a case, a shortened distance between two adjacent conductors may affect the performance of the flexible printed circuit board.

DETAILED DESCRIPTION

According to one embodiment, a disk device includes a magnetic disk, a magnetic head, and a flexible printed circuit board. The magnetic head is configured to read and write information from and to the magnetic disk. The flexible printed circuit board is electrically connected to the magnetic head. The flexible printed circuit board includes a first layer, a second layer having conductive property, and a third layer having insulation property. The first layer includes a first surface having insulation property. The second layer overlays the first surface and includes a first conductor and a second conductor spaced from the first conductor. The third layer covers at least a part of the first surface and at least a part of the second layer. The flexible printed circuit board is provided with a first hole that is located between the first conductor and the second conductor with spacing from the second layer and penetrates the third layer.

First Embodiment

Hereinafter, the first embodiment is described with reference to FIGS. 1 to 6. Note that, in the present specification, constituent elements according to the embodiments and descriptions of the constituent elements may be described in a plurality of expressions. The constituent elements and description thereof are examples, and are not limited by the expressions of the present specification. The constituent elements may also be identified with names different from those in the present specification. In addition, the constituent elements may be described by using an expression different from the expression of the present specification.

Figure 1:
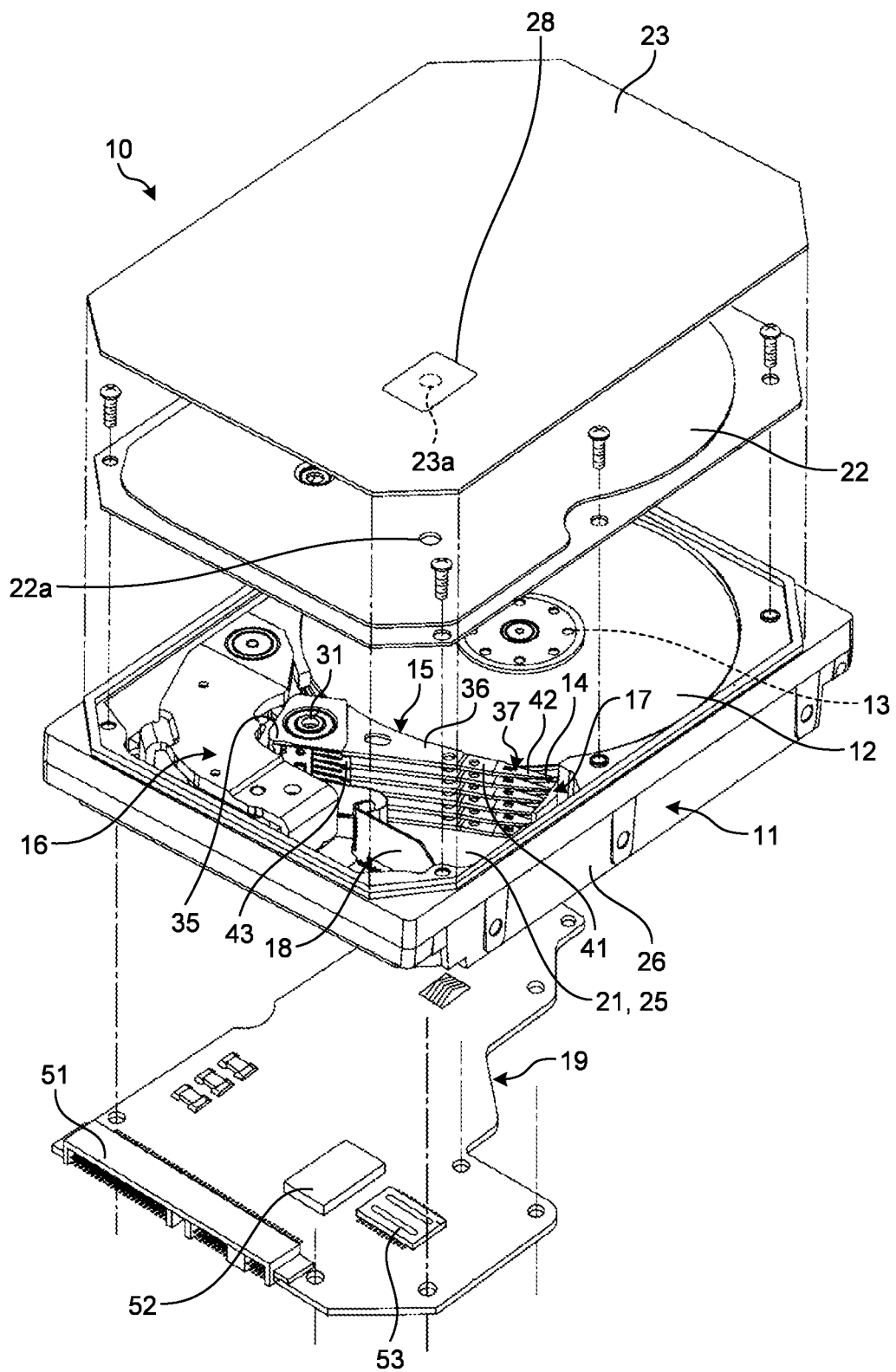
FIG. 1 is an exemplary perspective view illustrating an HDD according to a first embodiment.

FIG. 1 is an exemplary perspective view illustrating a hard disk drive (HDD) 10 according to the first embodiment. The HDD 10 is an example of the disk device, and may also be referred to as an electronic device, a storage device, an external storage device, or a magnetic disk device. The disk device is not limited to the HDD 10.

The RDD 10 includes a casing 11, a plurality of magnetic disks 12, a spindle motor 13, a plurality of magnetic heads 14, an actuator assembly 15, a voice coil motor (VCM) 16, a ramp load mechanism 17, a flexible printed circuit board (FPC) 18, and a printed wiring board (PCB) 19.

The casing 11 includes a base 21, an inner cover 22, and an outer cover 23. The base 21 is a bottomed container made of a metal material such as an aluminum alloy, and has a bottom wall 25 and a side wall 26. The bottom wall 25 is formed in a substantially rectangular (quadrangular) plate-like shape. The side wall 26 protrudes from an edge of the bottom wall 25. The bottom wall 25 and the side wall 26 are integrally formed.

The inner cover 22 and the outer cover 23 are made of a metal material such as an aluminum alloy, for example. The inner cover 22 is attached to an end of the side wall 26 with, for example, a screw. The outer cover 23 covers the inner cover 22 and is airtightly fixed to the end of the side wall 26 by welding, for example.

The casing 11 is sealed inside. Inside the casing 11, the magnetic disk 12, the spindle motor 13, the magnetic head 14, the actuator assembly 15, the VCM 16, the ramp load mechanism 17, and the FPC 18 are placed.

The inner cover 22 has a vent 22a. Further, the outer cover 23 has a vent 23a. After components are mounted inside the base 21 and the inner cover 22 and the outer cover 23 are attached to the base 21, air inside the casing 11 is removed through the vents 22a and 23a. Further, the casing 11 is filled with a gas different, from air.

The gas filled inside the casing 11 is, for example, a low density gas having a density lower than that of air, an inert gas having low reactivity, or the like. For example, the casing 11 is filled with helium. The casing 11 may be filled with another fluid. The inside of the casing 11 may be maintained at vacuum, low pressure close to vacuum, or negative pressure lower than atmospheric pressure.

The vent 23a of the outer cover 23 is closed by a seal 28. The seal 28 hermetically seals the vent 23a to prevent the leakage of the fluid filled in the casing 11 from the vent 23a.

The magnetic disk 12 is, for example, a disk having magnetic recording layers provided on an upper surface and a lower surface thereof. The diameter of the magnetic disk 12 is, for example, 3.5 inches; however, the diameter is not limited to the example. The plurality of magnetic disks 12 is stacked at intervals.

The spindle motor 13 supports and rotates the magnetic disks 12 thus stacked. The magnetic disks 12 are held in a hub of the spindle motor 13 by, for example, a clamp spring.

The magnetic head 14 records and reproduces information on and from the recording layer of the magnetic disk 12. Stated differently, the magnetic head 14 reads and writes information from and to the magnetic disk 12. The magnetic head 14 is mounted on the actuator assembly 15.

The actuator assembly 15 is rotatably supported by a support shaft 31 disposed at a position spaced from the magnetic disk 12. The VCM 16 rotates the actuator assembly 15 to place the same at a desired position. When the magnetic, head 14 moves to the outermost periphery of the magnetic disk 12, the ramp load mechanism 17 holds the magnetic head 14 at an unload position spaced from the magnetic disk 12.

The actuator assembly 15 includes an actuator block 35, a plurality of arms 36, and a plurality of head suspension assemblies 37. The head suspension assembly 37 is hereinafter referred to as a suspension 37. The suspension 37 may also be referred to as a head gimbal assembly (HGA).

The actuator block 35 is rotatably supported by the support shaft 31 through a bearing, for example. The plurality of arms 36 protrudes from the actuator block 35 in a direction substantially orthogonal to the support shaft 31. Another configuration is possible in which the actuator assembly 15 is divided and the arm 36 protrudes from each of the plurality of actuator blocks 35.

The plurality of arms 36 is placed at intervals in a direction in which the support shaft 31 extends. Each of the arms 36 is formed in a plate-like shape which allows the arm to enter an interval between the adjacent magnetic disks 12. The arms 36 extend substantially in parallel.

The actuator block 35 and the arms 36 are integrally made of, for example, aluminum. Note that the material of the actuator block 35 and the arms 36 is not limited to the example.

A voice coil of the VCM 16 is provided on a protrusion protruding from the actuator block 35 to the other side of the arm 36. The VCM 16 includes a pair of yokes, the voice coil disposed between the yokes, and a magnet provided on the yoke.

The VCM 16 rotates the actuator assembly 15 as described above. In other words, the VCM 16 rotates (moves) the actuator block 35, the arm 36, and the suspension 37 together.

The suspension 37 is attached to an end of the corresponding arm 36 and protrudes from the arm 36. Thereby, the plurality of suspensions 37 is placed at intervals in the direction in which the support shaft 31 extends.

Each of the suspensions 37 includes a base plate 41, a load beam 42, and a flexure 43. Further, the magnetic head 14 is mounted on a tip of the suspension 37.

The base plate 41 and the load beam 42 are made of, for example, stainless steel. Note that the materials of the base plate 41 and the load beam 42 are not limited to the example. The base plate 41 is formed in a plate-like shape and is attached to the end of the arm 36. The load beam 42 is formed in a plate-like shape thinner than the base plate 41. The load beam 42 is attached to an end of the base plate 41 and protrudes from the base plate 41.

The flexure 43 is formed in an elongated belt shape. Note that the shape of the flexure 43 is not limited to the example. The flexure 43 is a stacked plate including a metal plate (backing layer) made of stainless steel or the like, an insulating layer formed on the metal plate, a conductive layer formed on the insulating layer and constituting a plurality of wirings (wiring patterns), and a protective layer (insulating layer) covering the conductive layer.

A gimbal part (elastic support part) that is positioned on the load beam 42 and is displaceable is provided in one end of the flexure 43. The gimbal part is provided in the tip of the suspension 37 and the magnetic head 14 is mounted on the gimbal part. The other end of the flexure 43 is connected to the FPC 18. This allows the FPC 18 to be electrically connected to the magnetic head 14 through the wiring of the flexure 43.

The PCB 19 is, for example, a rigid board such as a glass epoxy board, and is a multilayer board, a build-up board, or the like. The PCB 19 is provided external to the casing 11 and is attached to the bottom wall 25 of the base 21. The PCB 19 is attached to the bottom wall 25 with, for example, a plurality of screws.

For example, an interface (I/F) connector 51, a controller 52, and a relay connector 53 are mounted on the PCB 19. Other components may be mounted on the PCB 19.

The I/F connector 51 is a connector conforming to an interface standard such as serial ATA (SATA), and is connected to an I/F connector of a host computer. The HOD 10 receives power supply from the host computer through the I/F connector 51, and sends and receives various pieces of data to and from the host computer.

The controller 52 is, for example, a system-on-chip (SoC), and includes a read/write channel (RWC), a hard disk controller (HDC), and a processor. Note that the RWC, the HDC, and the processor may be separate components.

The processor of the controller 52 is, for example, a central processing unit (CPU). The processor performs overall control of the HDD 10 according to firmware stored in advance in the ROM, for example. For example, the processor loads the firmware of the ROM into the RAM, and controls the magnetic head 14, the RWC, the HDC, and other parts according to the firmware thus loaded.

The relay connector 53 is electrically connected to various components placed inside the casing 11, for example, through a connector provided on the bottom wall 25. This allows the PCB 19 to be electrically connected to the spindle motor 13, the magnetic head 14, the actuator assembly 15, the VCM 16, and the FPC 18 placed inside the casing 11.

Figure 2:
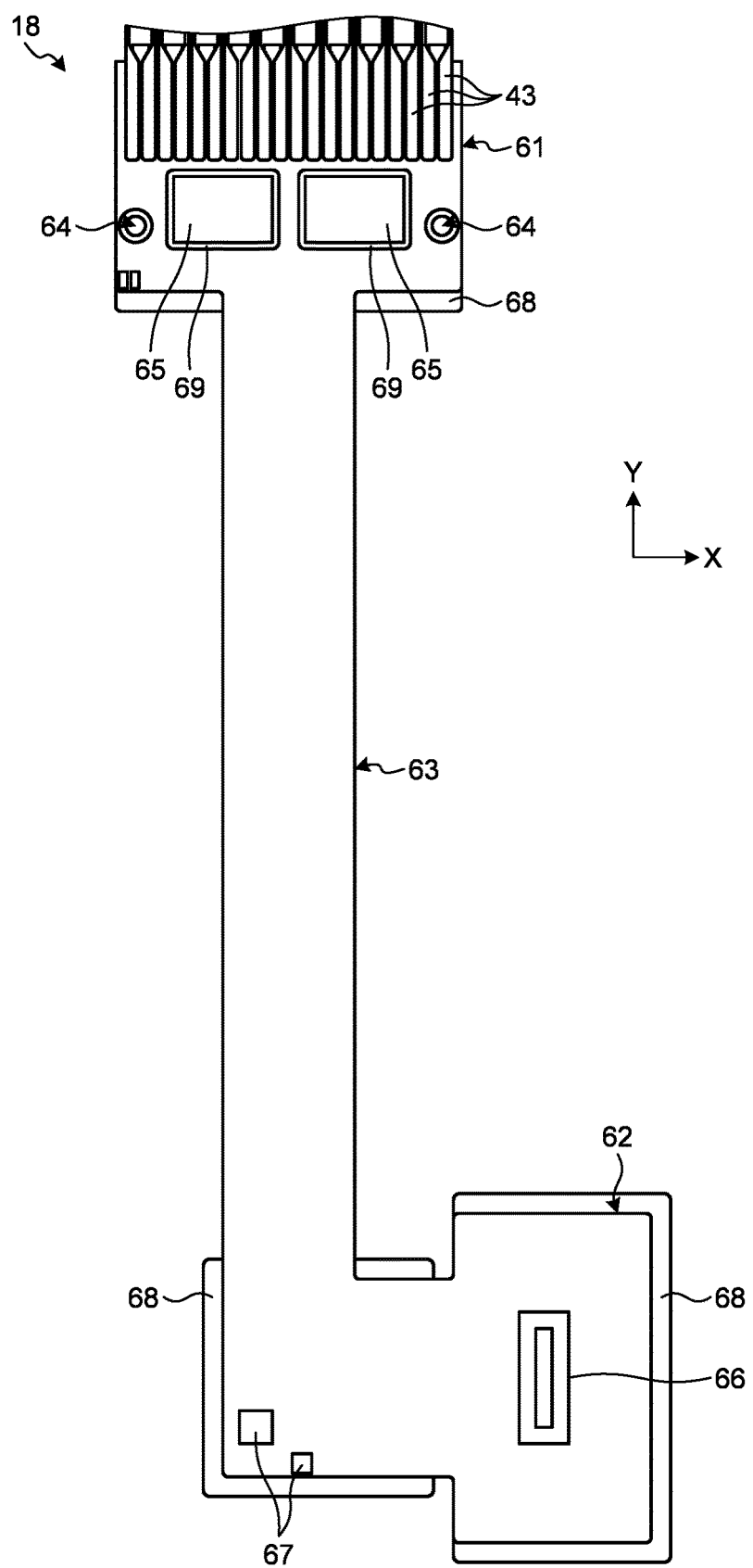
FIG. 2 is an exemplary plan view schematically illustrating an FPC of the first embodiment.

FIG. 2 is an exemplary plan view schematically illustrating the FPC 18 of the first embodiment. As illustrated in FIG. 2, the FPC 18 is formed in a substantially L-shaped belt shape in a natural state where the FPC 18 is detached from the other components and no external force acts. Note that the shape of the FPC 18 is not limited to the example. The FPC 18 includes a first connection part 61, a second connection part 62, and an intermediate part 63.

The first connection part 61 is provided, for example, in one end of the FPC 18 in a direction in which the FPC 18 extends. The first connection part 61 is attached to the actuator block 35 with, for example, a screw. The first connection part 61 is electrically connected to the VCM 16 and the flexure 43.

The first connection part 61 has a plurality of insertion holes 64. The insertion holes 64 penetrate the first connection part 61. For example, the screw inserts through the insertion hole 64 to attach the first connection part 61 to the actuator block 35. Note that the insertion hole 64 is not limited to the example. For example, a pin attached to the actuator block 35 through the insertion hole 64 may be fixed to the first connection part 61 by soldering.

The second connection part 62 is provided, for example, in the other end of the FPC 18 in the direction in which the FPC 18 extends. The second connection part 62 is attached to the bottom wall 25 with, for example, a screw. The second connection part 62 is electrically connected to the PCB 19 through, for example, a connector provided on the bottom wall 25.

The intermediate part 63 is provided between the first connection part 61 and the second connection part 62. The intermediate part 63 extends in a belt shape and bends between the first connection part 61 and the second connection part 62 in accordance with rotation of the actuator block 35.

As illustrated in the drawings, in the present specification, an X-axis, a Y-axis, and a Z-axis are defined for convenience. The X-axis, the Y-axis, and the Z-axis are orthogonal to one another. The X-axis is along the width of the intermediate part 63 in the natural state. The Y-axis is along the length of the intermediate part 63 in the natural state. The Z-axis is along the thickness of the FPC 18 in the natural state.

Further, in the present specification, an X-direction, a Y-direction, and a Z-direction are defined. The X-direction is a direction along the X-axis and includes a +X-direction indicated by an arrow of the X-axis and a −X-direction which is an opposite direction of the arrow of the X-axis. The Y-direction is a direction along the Y-axis and includes a +Y-direction indicated by an arrow of the Y-axis and a −Y-direction which is an opposite direction of the arrow of the Y-axis. The Z-direction is a direction along the Z-axis and includes a +Z-direction indicated by an arrow of the Z-axis and a −Z-direction which is an opposite direction of the arrow of the Z-axis.

The first connection part 61 is connected to an end of the intermediate part 63 in the +Y-direction and extends in the +Y-direction from the end. The second connection part 62 is connected to an end of the intermediate part 63 in the −Y-direction and extends in the +X-direction from the end. Note that the first connection part 61 and the second connection part 62 are not limited to the example.

The HDD 10 further includes a plurality of preamplifiers 65, a relay connector 66, a sensor 67, and a plurality of reinforcing plates 68. The preamplifier 65 is an example of a component and may also be referred to as a head amplifier. The reinforcing plate 68 is an example of a wall.

The preamplifier 65 is mounted on the first connection part 61. The preamplifier 65 is electrically connected to the flexure 43, for example, through a wiring and pads of the FPC 18. In addition, the preamplifier 65 is electrically connected to the magnetic head 14 through the flexure 43. The preamplifier 65 amplifies a write signal to send the write signal to the magnetic head 14, and amplifies a read signal sent from the magnetic head 14.

The preamplifier 65 is fixed to the FPC 18 with an underfill 69. The underfill 69 is provided and extends between the preamplifier 65 and the FPC 18. A part of the underfill 69 is attached to an edge of the preamplifier 65 and is located outside the space between the preamplifier 65 and the FPC 18.

The relay connector 66 and the sensor 67 are mounted on the second connection part 62. The relay connector 66 is electrically connected to the relay connector 53 of the PCB 19, for example, through a connector provided on the bottom wall 25. The second connection part 62 is thereby connected to the PCB 19. The relay connector 66 may be directly connected to the relay connector 53 of the PCB 19. The sensor 67 detects, for example, temperature and humidity inside the casing 11, and acceleration and angular acceleration of the HOD 10.

The reinforcing plate 68 is made of, for example, a metal such as aluminum or a synthetic resin, and is formed in a plate-like shape. Note that the reinforcing plate 68 is not limited to the example. The reinforcing plates 68 are attached to the first connection part 61 and the second connection part 62. The reinforcing plates 68 improve rigidity of the first connection part 61 and the second connection part 62.

Figure 3:
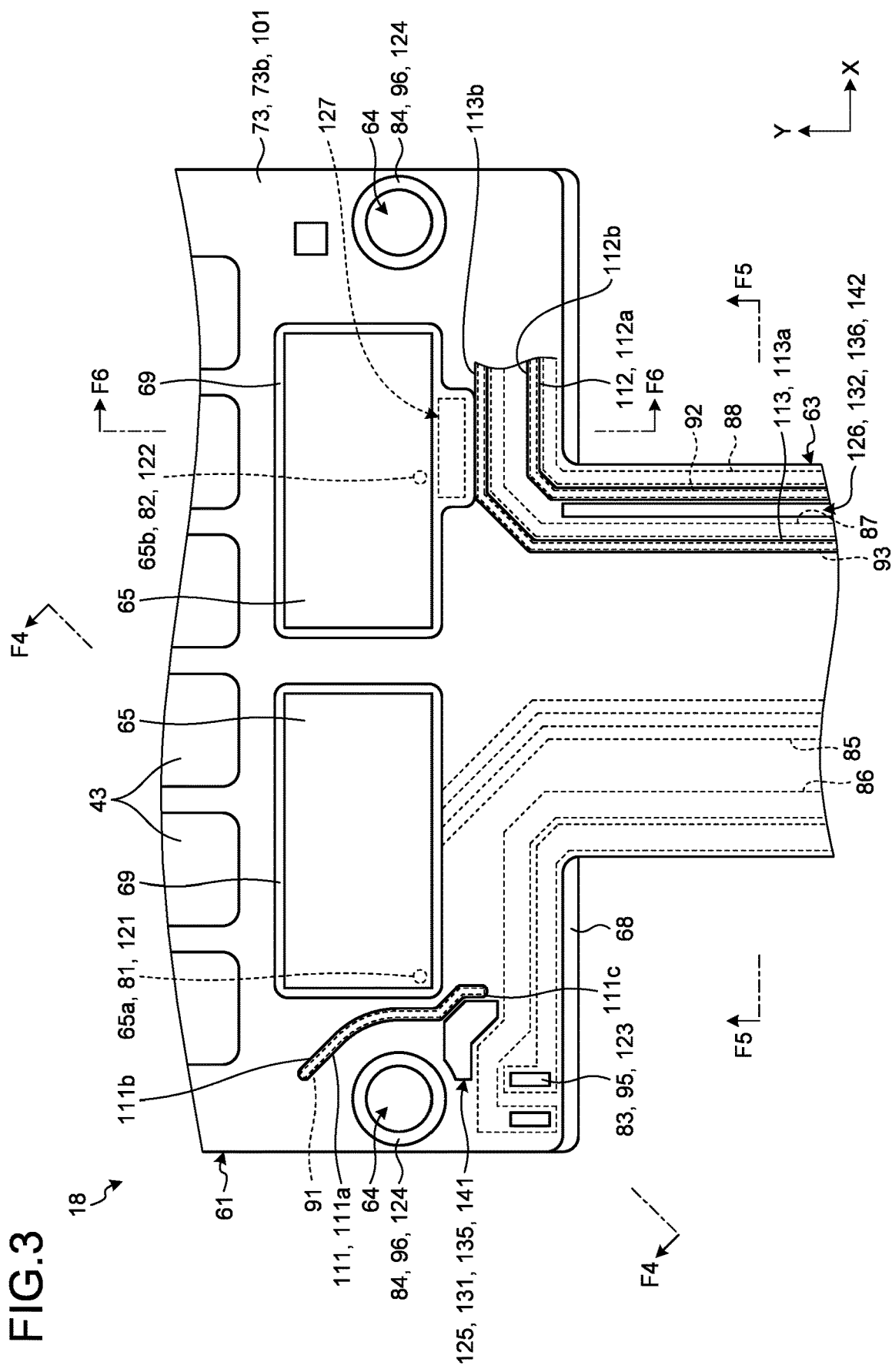
FIG. 3 is an exemplary plan view schematically illustrating a part of a first connection part of the first embodiment.
Figure 4:
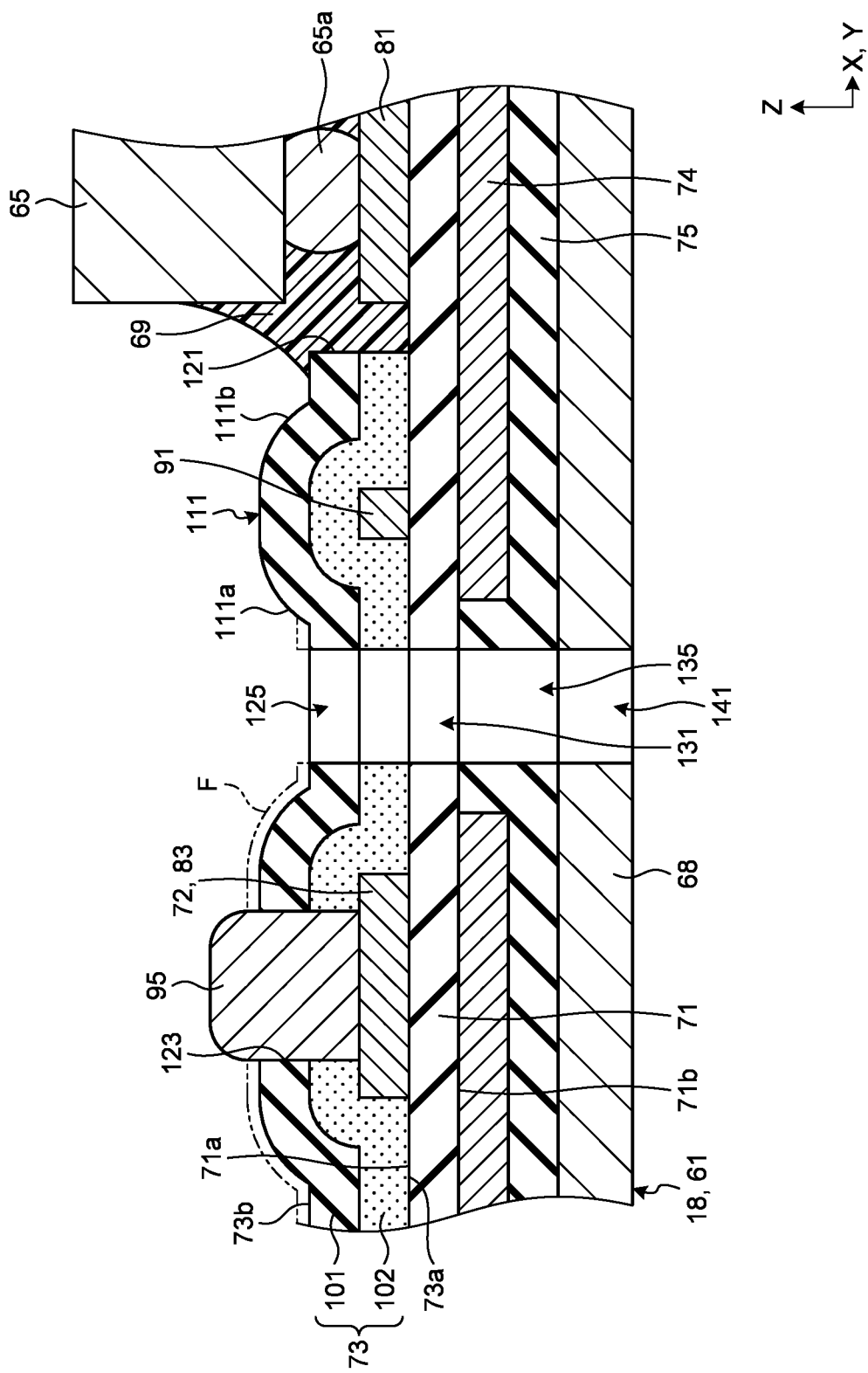
FIG. 4 is an exemplary cross-sectional view illustrating a part of the first connection part of the first embodiment taken along the line F4-F4 of FIG. 3.
Figure 5:
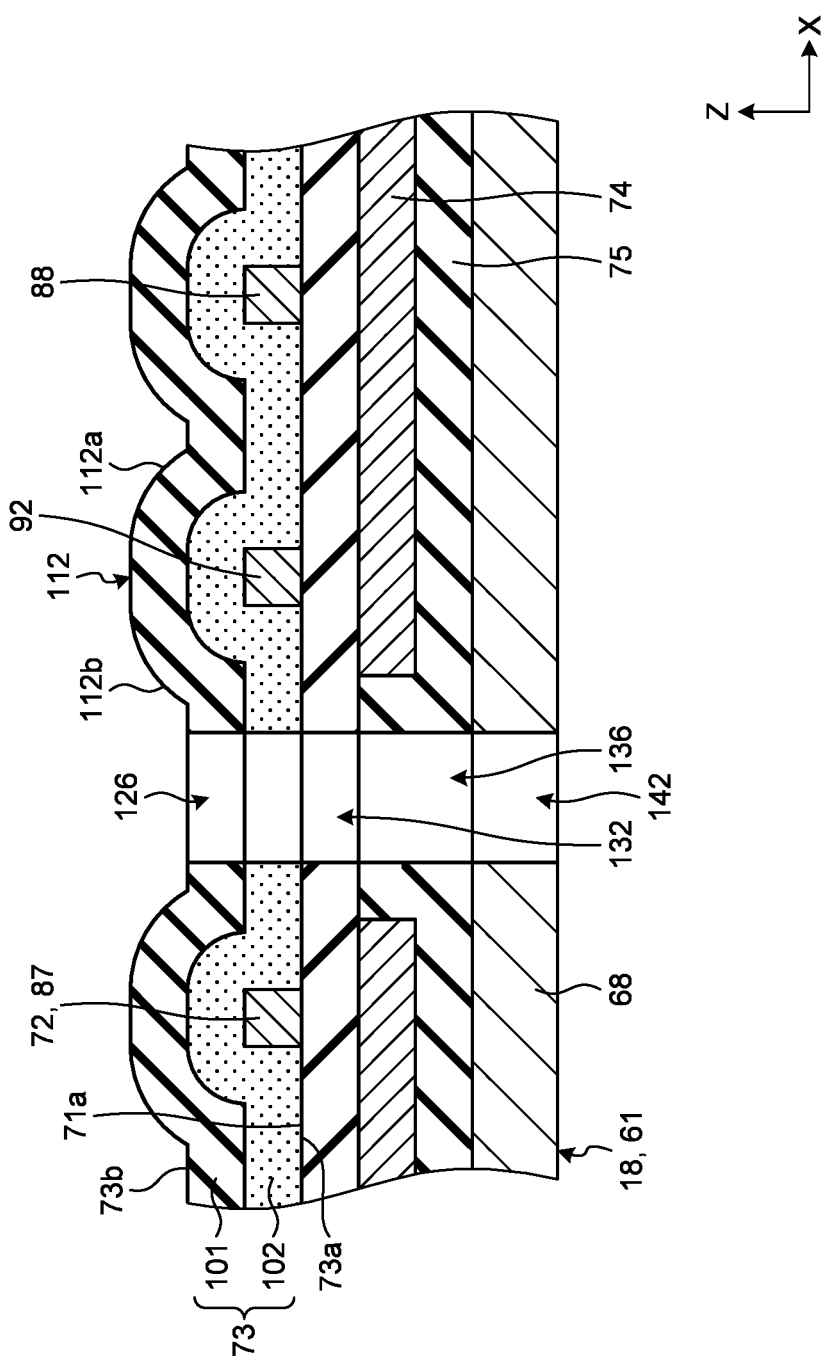
FIG. 5 is an exemplary cross-sectional view illustrating a part of the first connection part of the first embodiment taken along the line F5-F5 of FIG. 3.
Figure 6:
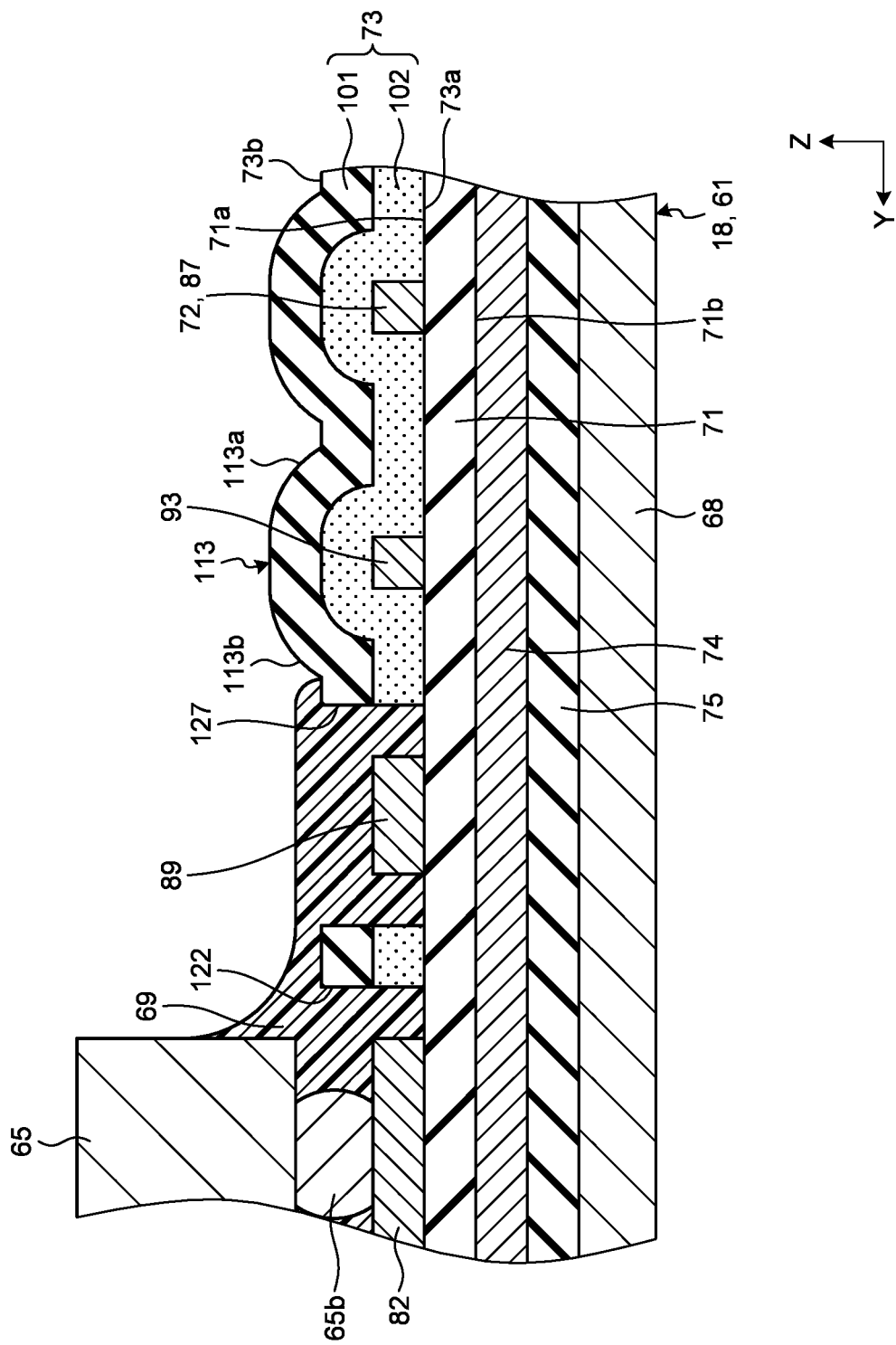
FIG. 6 is an exemplary cross-sectional view illustrating a part of the first connection part of the first embodiment taken along the line F6-F6 of FIG. 3.

FIG. 3 is an exemplary plan view schematically illustrating a part of the first connection part 61 of the first embodiment. FIG. 4 is an exemplary cross-sectional view illustrating a part of the first connection part 61 of the first embodiment taken along the line F4-F4 of FIG. 3. FIG. 5 is an exemplary cross-sectional view illustrating a part of the first connection part 61 of the first embodiment taken along the line F5-F5 of FIG. 3. FIG. 6 is an exemplary cross-sectional view illustrating a part of the first connection part 61 of the first embodiment taken along the line F6-F6 of FIG. 3.

As illustrated in FIG. 4, the FPC 18 includes a base layer 71, a conductive layer 72, a cover layer 73, ground layer 74, and a cover layer 75. The base layer 71 is an example of a first layer. The conductive layer 72 is an example of a second layer. The cover layer 73 is an example of a third layer.

The base layer 71 is made of, for example, an insulating material such as polyimide, and has insulation property. In a case where the FPC 18 is a multilayer FPC, the base layer 71 may have a plurality of insulating layers and a plurality of conductive layers.

The base layer 71 has an upper surface 71a and a lower surface 71b. Note that "upper" and "lower" in the present specification are convenient expressions on the basis of the vertical direction in FIG. 4, and are not intended to limit the direction, Position, and other conditions. The upper surface 71a is an example of a first surface.

The upper surface 71a is a surface of the base layer 71 facing the Z-direction. The lower surface 71b is located on the opposite side of the upper surface 71a and is a surface of the base layer 71 facing the −Z-direction. Since the base layer 71 is made of an insulating material, the upper surface 71a has insulation property. For example, in a case where the FPC 18 is a multilayer FPC, a conductor may be exposed on the upper surface 71a.

On the lower surface 71b, the ground layer 74 made of a conductor such as copper is provided. The cover layer 75 is made of, for example, an insulating material such as polyimide to cover the ground layer 74. In a case where the FPC 18 is a multilayer FPC, the ground layer 74 may be provided inside the base layer 71.

The conductive layer 72 is made of, for example, a conductor such as copper and has conductive property. The conductive layer 72 overlays the upper surface 71a of the base layer 71. An adhesive layer may be provided between the conductive layer 72 and the upper surface 71a.

The conductive layer 72 includes a plurality of pads 81, 82, 83, and 84, a signal wiring 85, a power supply wiring 86, two gimbal micro actuators (GMA) wirings 87 and 88 illustrated in FIG. 3, and a conductor 89 illustrated in FIG. 6. Further, the conductive layer 72 includes a plurality of ground wirings 91, 92, and 93 illustrated in FIG. 3.

The pads 81 and 82 and the GMA wiring 87 are an example of a first conductor. The pads 83 and 84, the power supply wiring 86, and the GMA wiring 88 are an example of a second conductor. The GMA wiring 87 is an example of a first wiring. The GMA wiring 88 is an example of a second wiring. The pads 81, 82, 83, and 84 may also be referred to as lands, terminals, or electrodes.

Each of the pads 81 and 82 is one of pads to which the preamplifier 65 is connected. As illustrated in FIG. 4, a terminal 65a of the preamplifier 65 is connected to the pad 81. As illustrated in FIG. 6, a terminal 65b of the preamplifier 65 is connected to the pad 82. The terminals 65a and 65b are, for example, solder balls. Note that the terminals 65a and 65b are not limited to the example.

The pad 83 illustrated in FIG. 4 is connected to a terminal of the voice coil of the VCM 16. The pad 83 is connected to the VCM 16 through solder 95. That is, the solder 95 is attached to the pad 83. The pad 83 is spaced from the pads 81 and 82.

As illustrated in FIG. 3, the pad 84 is provided in a substantially annular shape along an edge of the insertion hole 64. The pad 84 is covered with the solder 96 and protected by the solder 96. Note that the pad 84 is not limited to the example. The pad 84 is spaced from the pads 81 and 82.

The signal wiring 85 extends along the upper surface 71a between the relay connector 66 and the preamplifier 65, for example. The signal wiring 85 is connected to the pad 81 or another pad to which the preamplifier 65 is connected, and sends a read signal and a write signal. Note that the signal wiring 85 is not limited to the example. The signal wiring 85 is spaced from the pads 83 and 84.

The power supply wiring 86 extends along the upper surface 71a between the relay connector 66 and the pad 83, for example. The power supply wiring 86 is connected to the pad 83 and supplies power to the VCM 16. Note that the power supply wiring 86 is not limited to the example. The power supply wiring 86 is spaced from the pads 81, 82, and 84 and the signal wiring 85.

The GMA wirings 87 and 88 extend along the upper surface 71a between the relay connector 66 and the flexure 43, for example. The GMA wirings 87 and 88 extend substantially in parallel. The GMA wiring 88 thus extends along the GMA wiring 87. Note that the distance between the two GMA wirings 87 and 38 may not be constant. The GMA wiring 87 is closer to the preamplifier 65 than the GMA wiring 88.

The GMA wirings 87 and 88 are electrically connected to, for example, the magnetic head 14 of a microwave assisted magnetic recording (MAMR) system or a heat assisted magnetic recording (HANK) system, and the GMA wirings 87 and 88 send a control signal for a laser beam or microwave source. Note that the GMA wirings 87 and 88 are not limited to the example.

The conductor 89 illustrated in FIG. 6 is located between the pad 82 and the GMA wiring 87. The conductor 89 is, for example, an inspection pattern used for inspection of the FPC 18. Note that the conductor 89 is not limited to the example, and may be, for example, a wiring.

The ground wirings 91, 92, and 93 are electrically connected to the ground. For example, the ground wirings 91, 92, and 93 are electrically connected to the ground layer 74 through a via.

As illustrated in FIG. 3, the ground wiring 91 extends through a region between the pad 81 and the pad 33, a region between the pad 81 and the pad 84, and a region between the pad 81 and the power supply wiring 86. The ground wiring 91 is thus located between the pad 81 and the pad 83 and between the pad 81 and the pad 84. The ground wiring 91 is also located between the underfill 69 and the pad 83 and between the underfill 69 and the pad 84.

The ground wiring 92 is located between the GMA wiring 87 and the GMA wiring 88. The ground wiring 93 is located between the pad 82 and the GMA wiring 87. The ground wirings 92 and 93 extend substantially parallel to the GMA wirings 87 and 88. Note that the ground wirings 92 and 93 may be shorter than the GMA wirings 87 and 88.

As illustrated in FIG. 4, the cover layer 73 covers at least a part of the upper surface 71a of the base layer 71 and at least apart of the conductive layer 72. For example, the cover layer 73 covers the signal wiring 85, the power supply wiring 86, the GMA wirings 87 and 83, and the ground wirings 91, 92, and 93. The cover layer 73 has a lower surface 73a and an upper surface 73b. The lower surface 73a is an example of a second surface. The upper surface 73b is an example of a third surface.

The lower surface 73a is a surface of the cover layer 73 facing the −Z-direction. The lower surface 73a faces the upper surface 71a of the base layer 71. The upper surface 73b is located on the opposite side of the lower surface 73a and is a surface of the cover layer 73 facing the Z-direction. The upper surface 73b forms a surface of the FPC 18.

The cover layer 73 includes a cover film 101 and an adhesive 102. The cover film 101 is made of, for example, an insulating material such as polyimide. The adhesive 102 is made of, for example, an insulating adhesive. The cover layer 73 thus has insulation property. In other words, the electrical resistance of each of the base layer 71 and the cover layer 73 is higher than the electrical resistance of the conductive layer 72.

The adhesive 102 is interposed between the cover film 101 and the upper surface 71a of the base layer 71 and the conductive layer 72. The adhesive 102 adheres the cover film 101 to the upper surface 71a of the base layer 71 and the conductive layer 72.

The cover layer 73 has a substantially constant thickness and covers the upper surface 71a of the base layer 71 and the conductive layer 72. Therefore, the cover layer 73 protrudes (rises) from the upper surface 73b at a position where the conductive layer 72 is provided. As illustrated in FIG. 3, the cover layer 73 has a plurality of protrusions 111, 112, and 113.

As illustrated in FIG. 4, the protrusion 111 is a part of the cover layer 73 that covers the ground wiring 91. The protrusion 111 protrudes from the upper surface 73b along the ground wiring 91 and extends along the ground wiring 91. The protrusion 111 is thus located between the pad 81 and the pad 83 and between the pad 81 and the pad 84 in a direction along the upper surface 71a of the base layer 71. The protrusion 111 is located also between the underfill 69 and the pad 83 and between the underfill 69 and the pad 84.

The protrusion 111 has two side surfaces 111a and 111b. The side surface 111a is an example of a first protruding surface and a protruding surface. The side surfaces 111a and 111b protrude (stick out, rise) from the upper surface 73b along the ground wiring 91, and face in a direction intersecting the direction in which the upper surface 73b faces.

The side surface ilia is closer to the pad 83 than the side surface 111b, and is closer to the pad 84 than the side surface 111b. The side surface 111b is located on the opposite side of the side surface 111a. The side surface 111b is closer to the pad 81 than the side surface 111a.

As illustrated in FIG. 5, the protrusion 112 is a part of the cover layer 73 that covers the ground wiring 92. The protrusion 112 protrudes from the upper surface 73b along the ground wiring 92 and extends along the ground wiring 92. The protrusion 112 is thus located between the GMA wiring 87 and the GMA wiring 88 in the direction along the upper surface 71a of the base layer 71.

The protrusion 112 has two side surfaces 112a and 112b. The side surfaces 112a and 112b protrude from the upper surface 73b along the ground wiring 92, and face in the direction intersecting the direction in which the upper surface 73b faces. The side surface 112a is closer to the GMA wiring 88 than the side surface 112b. The side surface 112b is located on the opposite side of the side surface 112a. The side surface 112b is closer to the GMA wiring 87 than the side surface 112a.

As illustrated in FIG. 6, the protrusion 113 is a part of the cover layer 73 that covers the ground wiring 93. The protrusion 113 protrudes from the upper surface 73b along the ground wiring 93 and extends along the ground wiring 93. The protrusion 113 is thus located between the pad 82 and the GMA wiring 87 in the direction along the upper surface 71a of the base layer 71.

The protrusion 113 has two side surfaces 113a and 113b. The side surfaces 113a and 113b protrude from the upper surface 73b along the ground wiring 93, and face in the direction intersecting the direction in which the upper surface 73b faces. The side surface 113a is closer to the GMA wiring 87 than the side surface 113b. The side surface 113b is located on the opposite side of the side surface 113a. The side surface 113h is closer to the pad 82 than the side surface 113a.

As illustrated in FIG. 3, the cover layer 73 has a plurality of exposure holes 121, 122, 123, and 124 and a plurality of through holes 125, 126, and 127. The exposure holes 123 and 124 are an example of a second hole. The through holes 125, 126, and 127 are an example of a first hole.

The exposure holes 121, 122, 123, and 124 and the through holes 125, 126, and 127 penetrate the cover layer 73 in the Z-direction. The exposure holes 121, 122, 123, and 124 and the through holes 125, 126, and 127 are thus open to the upper surface 73b and the lower surface 73a.

As illustrated in FIG. 4, the exposure hole 121 exposes the pad 81. In other words, the cover layer 73 does not cover the pad 81 in a part where the exposure hole 121 is provided. As illustrated in FIG. 6, the exposure hole 122 exposes the pad 82. As illustrated in FIG. 4, the exposure hole 123 exposes the pad 83. The exposure hole 124 exposes the pad 84.

The through holes 125, 126, and 127 are spaced from the conductive layer 72 in the direction along the upper surface 71a. The through holes 125, 126, and 127 thus do not expose the conductive layer 72. In other words, the through holes 125, 126, and 127 do not overlap the conductive layer 72 in the Z-direction.

As illustrated in FIG. 3, the through hole 125 is located between the pad 81 and the pad 83, between the pad 81 and the pad 84, and between the pad 81 and the power supply wiring 86. In addition, the through hole 125 is located between the underfill 69 and the solder 95 and between the underfill 69 and the solder 96 in the direction along the upper surface 71a of the base layer 71.

The through hole 125 is located between the ground wiring 91 and the pad 83 and between the ground wiring 91 and the power supply wiring 86. Further, the through hole 125 is located between the side surface 111a of the protrusion 111 and the exposure hole 123 in the direction along the upper surface 71a of the base layer 71. Further, the through hole 125 is located in the vicinity of an end 111c of the side surface 111a in a direction in which the side surface 111a of the protrusion 111 extends.

The through hole 126 is located between the GMA wiring 87 and the GMA wiring 88. The through hole 126 is located between the ground wiring 92 and the GMA wiring 87. Further, the through hole 126 is located between the side surface 112a of the protrusion 112 and the GMA wiring 87 in the direction along the upper surface 71a of the base layer 71.

The through hole 127 is located between the pad 82 and the GMA wiring 87. The through hole 127 is located between the ground wiring 93 and the pad 82. Further, the through hole 127 is also located between the side surface 113a of the protrusion 113 and the pad 82 in the direction along the upper surface 71a of the base layer 71.

As illustrated in FIG. 6, the through hole 127 exposes the upper surface 71a of the base layer 71 and the conductor 39. In other words, the cover layer 73 does not cover the conductor 89 in a part where the through hole 127 is provided. However, a part of the underfill 69 fills the through hole 127 and covers the conductor 89. That is, a part of the underfill 69 is located in the through hole 127.

As illustrated in FIGS. 4 and 5, through holes 131 and 132 are provided in the base layer 71. The through holes 131 and 132 are an example of a third hole. The through holes 131 and 132 penetrate the base layer 71 in the –direction. The through holes 131 and 132 are thus open to the upper surface 71a and the lower surface 71b.

The through hole 131 has substantially the same shape as the through hole 125 of the cover layer 73. The through hole 131 overlaps the through hole 125 in the Z-direction and communicates with the through hole 125. The shape of the through hole 131 may be different from the shape of the through hole 125.

The through hole 132 has substantially the same shape as the through hole 126 of the cover layer 73. The through hole 132 overlaps the through hole 126 in the Z-direction and communicates with the through hole 126. The shape of the through hole 132 may be different from the shape of the through hole 126.

Through holes 135 and 136 are provided in the ground layer 74 and the cover layer 75. Each of the through holes 135 and 136 penetrates the ground layer 74 and the cover layer 75 in the Z-direction.

The through hole 135 has substantially the same shape as the through hole 131 of the base layer 71. The through hole 135 overlaps the through hole 131 in the Z-direction and communicates with the through hole 131. The shape of the through hole 135 may be different from the shape of the through hole 131.

The through hole 136 has substantially the same shape as the through hole 132 of the base layer 71. The through hole 136 overlaps the through hole 132 in the Z-direction and communicates with the through hole 132. The shape of the through hole 136 may be different from the shape of the through hole 132.

The reinforcing plate 68 is attached to the FTC 18 so as to cover the lower surface 71b of the base layer 71. Thus, the base layer 71 is located between the cover layer 73 and the reinforcing plate 68. The rigidity of the reinforcing plate 68 is higher than the rigidity of the base layer 71 and higher than the rigidity of the cover layer 73. The reinforcing plate 68 has through holes 141 and 142. The through holes 141 and 142 are an example of a fourth hole. The through holes 141 and 142 penetrate the reinforcing plate 68 in the Z-direction.

The through hole 141 has substantially the same shape as the through hole 131 of the base layer 71. The through hole 141 overlaps the through holes 131 and 135 in the Z-direction and communicates with the through hole 131 through the through hole 135. The shape of the through hole 141 may be different from the shape of the through hole 131.

The through hole 142 has substantially the same shape as the through hole 132 of the base layer 71. The through hole 142 overlaps the through holes 132 and 136 in the Z-direction and communicates with the through hole 132 through the through hole 136. The shape of the through hole 142 may be different from the shape of the through hole 132.

The through holes 125, 126, 131, 132, 135, 136, 141, and 142 are hollowed out and are not filled with a solid or a liquid. Therefore, the inside of the through holes 125, 126, 131, 132, 135, 136, 141, and 142 is filled with gas in the casing 11 or is in a vacuum. Note that the through holes 125, 126, 131, 132, 135, 136, 141, and 142 are not limited to the example. In addition, it is possible that the through holes 131, 132, 135, 136, 141, and 142 are not provided. In such a case, the through holes 125 and 126 expose the upper surface 71a of the base layer 71.

Hereinafter, a method for mounting a component on the FPC 18 is partly exemplified. The method for mounting a component on the FPC 18 is not limited to the following method, and other methods may be used. First, solder paste (solder 95 and 96) is supplied to the pads 83 and 84 by, for example, printing or coating. Further, the solder paste may be supplied to the pads 81 and 82.

Next, the preamplifier 65 is mounted on the pads 81 and 82. Further, a terminal of the VCM 16 is mounted on the pad 83. Next, the FPC 18 is heated in a reflow furnace, so that the solder paste and the solder ball are melted. As a result, the terminals 65a and 65b of the preamplifier 65 are bonded to the pads 81 and 82, the terminal of the VCM 16 is bonded to the Pad 83, and the solder 96 covers the pad 84. At this time, as illustrated in FIG. 4, flux F mixed with or separately supplied to the solder 95 and 96 may flow out of the solder 95 and 96.

Next, the underfill 69 is supplied between the preamplifier 65 and the FPC 13. The underfill 69 is also supplied to the through hole 127 to cover the conductor 89. At this time, in a case where the flux F is mixed with the underfill 69, a substance that may contaminate the HDD 10 may be generated. For example, a crumbly sponge-like substance may be generated. However, the HDD 10 according to this embodiment can reduce the mixing of the flux F and the underfill 69.

As illustrated in FIG. 4, the flux F flows out of the solder 95 supplied to the pad 83, for example, and wets and spreads along the upper surface 73h of the cover layer 73. The flux F also flows out of the solder 96 supplied to the pad 84. When the flux F reaches the through hole 125, which is open to the upper surface 73b, the flux F stays at the edge of the through hole 125 due to surface tension. That is, the through hole 125 can block the flux F.

The flux F may flow into the through hole 125. In such a case, the flux F accumulates in the through holes 125, 131, 135, and 141 or is discharged through the through holes 125, 131, 135, and 141. Thus, the through hole 125 can block the flux F.

The flux F may go over the through hole 125 or bypass the through hole 125 to wet and spread toward the underfill 69. However, the flux F is blocked by the side surface 111a of the protrusion 111.

The flux F that has bypassed the through hole 125 may flow along the side surface 111a of the protrusion 111. The flux F spreads from the end 111c of the side surface 111a when reaching the end 111c. However, since the through hole 125 is provided in the vicinity of the end 111c, the flux F flows into the through hole 125. As described above, the side surface 111a of the protrusion 111 and the through hole 125 between the solder 95 and 96 and the underfill 69 block the flux F.

The through hole 127 illustrated in FIG. 6 is formed so as to block the flux F and allow the underfill 69 to flow in. For example, the angle of the edge of the through hole 127 is partially different. Thus, of the edge of the through hole 127, a part thereof close to the underfill 69 allows the underfill 69 to pass therethrough. On the other hand, of the edge of the through hole 127, a part thereof close to the solder blocks the flux F. Note that the through hole 127 is not limited to the example.

Next, the underfill 69 is cured by, for example, heat. This allows the underfill 69 to fix the preamplifier 65 to the FPC 18. Next, the FPC 18 is cleaned by, for example, ultrasonic cleaning, and the flux F is removed. Thus, the mounting of the component on the FPC 18 is completed.

In the HDD 10 according to the first embodiment described above, the FPC 18 includes the base layer 71, the conductive layer 72, and the cover layer 73 having insulation property. The base layer 71 has the upper surface 71a having insulation property. The conductive layer 72 overlays the upper surface 71a and includes a first conductor (pads 81 and 82, and GMA wiring 87) and a second conductor (pads 83 and 84, and GMA wiring 88) spaced from the first conductor. The cover layer 73 covers at least a part of the upper surface 71a and at least a part of the conductive layer 72. The FPO 18 is provided with the through holes 125, 126, and 127. The through holes 125, 126, and 127 are located between the first conductors 81, 82, and 87 and the second conductors 83, 84, and 88 with spacing from the conductive layer 72 and penetrate the cover layer 73. For example, the preamplifier 65 attached to the pad 31 may be fixed to the FPC 18 with the underfill 69 while the pads 83 and 84 may be applied with the solder 95 and 96. With the pad 81 and the pads 83 and 84 arranged at short intervals, the flux F may flow out of the solder 95 and 96 to the underfill 69. In such a case the underfill 69 may mix with the flux F of the solder 95 and 96, causing a substance that can contaminate the HDD 10. However, in the HDD 10 of this embodiment, the through hole 125 extends between the pad 81 and the pads 83 and 84. Thus, the through hole 125 can work to block the flux F, flowing out of the solder 95 and 96 attached to the pads 83 and 84, before reaching the underfill 69. As such, in spite of proximity between the pad 81 and the pads 83 and 84, the HDD 10 according to this embodiment can prevent the flux F and the underfill 69 from being mixed, lowering the possibility to contaminate the HDD 10. In other words, the HDD 10 can reduce the influence arising from the close arrangement of the pad 81 and the pads 83 and 84. In addition, in the HDD 10 according to this embodiment, the hollow, through holes 125, 126, and 127 can insulate the first conductors 81, 82, and 87 from the second conductors 83, 84, and 88. Thus, in spite of proximity between the first conductors 81, 82, and 87 and the second conductors 83, 34, and 88, the HDD 10 according to this embodiment can prevent occurrence of short circuit or noise transmission between the first conductors 81, 82, and 87 and the second conductors 83, 84, and 88. In other words, the HDD 10 can reduce the influence arising from the close arrangement of the first conductors 81, 82, and 87 and the second conductors 83, 84, and 88.

For example, the potential difference between the two sets of GMA wiring 87 and 88 is larger than the potential difference between the signal wiring 85 and the power supply wiring 86. In general, dielectric breakdown may occur in an insulator such as the cover layer 73 between two interconnections having a large potential difference. In this embodiment, however, the through hole 126 filled with gas or in a vacuum extends between the GMA wirings 87 and 88. The electrical resistance of the gas or the vacuum space is higher than the electrical resistance of a solid such as polyimide. Because of this, the through hole 126 can prevent occurrence of dielectric breakdown between the two GMA wirings 87 and 88 having a large potential difference. In addition, the gas or the vacuum space has a lower thermal conductivity than a solid such as polyimide. Thus, the through hole 126 can work to prevent heat transfer between the two sets of GMA wiring 87 and 88.

For example, while traveling across the signal wiring 85 for a higher-speed signal transmission, the signal is more susceptible to noise from the power supply wiring 86 caused by parasitic impedance, for example. However, in this embodiment, the through hole 125 filled with gas or in a vacuum extends between the signal wiring 85 and the power supply wiring 86. Thus, the through hole 125 can work to prevent noise transmission between the signal wiring 85 and the power supply wiring 86.

The preamplifier 65 is connected to the pad 81. The underfill 69 extends between the preamplifier 65 and the FPC 18. The solder 95 and 96 adhere to the pads 83 and 84. The through hole 125 is located between the underfill 69 and the solder 95 and 96. Thereby, the through hole 125 can block the flux F flowing out of the solder 95 and 96 before reaching the underfill 69. Consequently, the HDD 10 according to this embodiment can prevent the flux F and the underfill 69 from being mixed.

The cover layer 73 has the lower surface 73a and the upper surface 73b. The lower surface 73a faces the upper surface 71a. The upper surface 73b is opposite the lower surface 73a. The cover layer 73 is provided with the exposure holes 123 and 124. The exposure holes 123 and 124 are open to the upper surface 73b and expose the pads 83 and 84. The FPC 18 has the side surface 111a between the pad 81 and the pads 83 and 84 in the direction along the upper surface 71a. The side surface 111a protrudes from the upper surface 73b. The flux F may flow out of the solder 95 and 96 attached to the pads 83 and 34 and spread over the upper surface 73b. The flux F is, however, blocked by the protruding side surface 111a on the upper surface 73b before reaching the underfill 69. Thus, the HDD 10 according to this embodiment can prevent the flux F and the underfill 69 from being mixed.

The through hole 125 is located between the side surface 111a and the exposure holes 123 and 124 in the direction along the upper surface 71a. Thereby, the through hole 125 can block the flux F out of the solder 95 and 96 attached to the pads 83 and 84, before the side surface 111a blocks. As a result, in the HDD 10 according to this embodiment, it is possible to prevent the flux F from flowing over the side surface 111a, even if it has a relatively low height, to reach the underfill 69.

The conductive layer 72 includes the sets of ground wiring 91, 92, and 93. The ground wiring sets 91, 92, and 93 are located between the first conductors 81, 82, and 87 and the second conductors 83, 84, and 88, and are electrically connected to the ground. The side surface 111a protrudes from the upper surface 73b along the ground wiring 91. The side surface 111a can be formed on the cover layer 73, for example, by stacking the cover layers 73 on the ground wiring 91. This eliminates the necessity to add special steps for forming the side surface 111a, which can prevent cost increase in the HDD 10 of this embodiment. Further, the ground wiring sets 91, 92, and 93 can serve to prevent occurrence of short circuit due to dielectric breakdown or noise transmission due to parasitic impedance between the first conductors 81, 82, and 87 and the second conductors 83, 84, and 88.

The through hole 125 is located adjacent to the end 111c of the side surface 111a in the direction in which the side surface 111a extends. Thereby, the through hole 125 can block the flux F, when blocked by the side surface 111a, for example, from flowing further around the end 111c of the side surface 111a. Thereby, the HDD 10 according to this embodiment can prevent the flux F and the underfill 69 from being mixed.

The reinforcing plate 68 has rigidity higher than the base layer 71 and is attached to the FPC 18. The base layer 71 is provided with the through hole 131 extending between the cover layer 73 and the reinforcing plate 68 and penetrating the base layer 71 to communicate with the through hole 125. The reinforcing plate 68 is provided with the through hole 141 penetrating the reinforcing plate 68 to communicate with the through hole 131. In other words, the through holes 125, 131, and 141 form a continuous hole penetrating the base layer 71, the cover layer 73, and the reinforcing plate 68. Since the continuous hole has a volume larger than the through hole 125, the continuous hole can store, i.e., block a larger amount of flux F than the through hole 125. Thus, the HDD 10 according to this embodiment can prevent the flux F and the underfill 69 from being mixed. Further, for cleaning purpose, a cleaning liquid can flow through the continuous hole. As a result, the cleaning liquid can effectively remove the stored flux F from the continuous hole.

The conductive layer 72 includes the conductor 89 exposed from the through hole 127. The underfill 69 is partly located in the through hole 127 to cover the conductor 89. In general, supply and reflow of the solder are conducted before supply of the underfill 69. Because of this, before supply of the underfill 69, i.e., without inflow of the underfill 69, the through hole 127 can block the flux F flowing out of the solder. Further, after the underfill 69 is supplied, the underfill 69 covers the conductor 89. The underfill 69 thus can prevent the conductor 89 from being short-circuited or corroded.

The first conductors 81, 82, and 87 include the GMA wiring 87 extending along the upper surface 71a. The second conductors 83, 84, and 88 include the GMA wiring 88 extending along the GMA wiring 87. The cover layer 73 covers the GMA wirings 87 and 88. The through hole 126 extends between the GMA wiring 87 and the GMA wiring 88. In the HDD 10 according to this embodiment, the hollow, through hole 126 can insulate the GMA wiring 87 from, the GMA wiring 88. Consequently, the HDD 10 according to this embodiment can prevent occurrence of short circuit or noise transmission between the GMA wiring 87 and the GMA wiring 88.

Second Embodiment

Hereinafter, the second embodiment is described with reference to FIG. 7. In the following description of the plurality of embodiments, constituent elements having functions similar to those of the constituent elements already described are denoted by the same reference numerals as those of the constituent elements already described, and the description thereof may be omitted. Further, the plurality of constituent elements denoted by the same reference numerals do not necessarily have all the functions and properties in common, and may have different functions and properties according to the embodiments.

Figure 7:
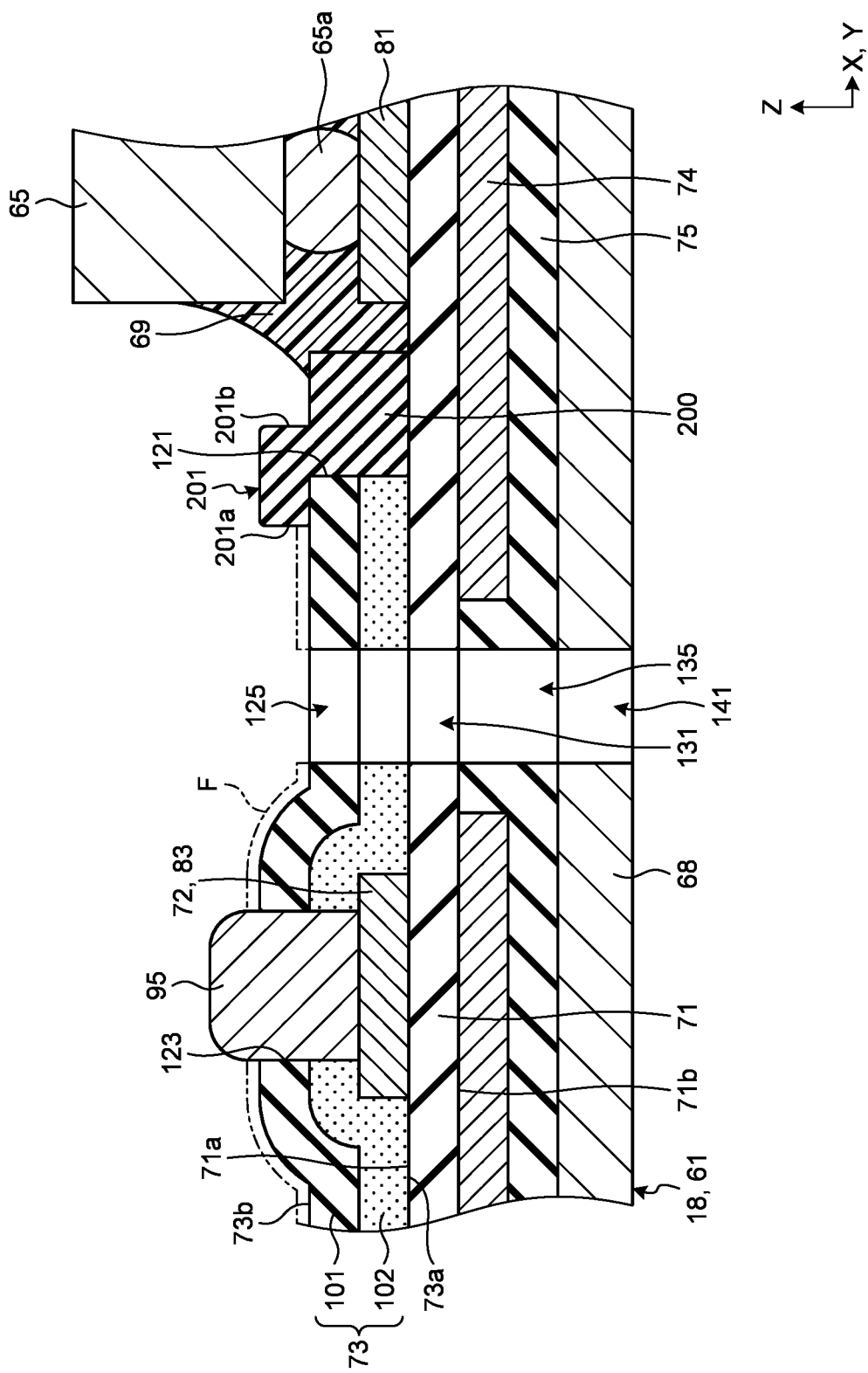
FIG. 7 is an exemplary cross-sectional view illustrating a part of a first, connection part according to a second embodiment.

FIG. 7 is an exemplary cross-sectional view illustrating a part of the first connection part 61 according to the second embodiment. As illustrated in FIG. 7, the FPC 18 of the second embodiment includes a resist 200 instead of the ground wiring 91 and the protrusion 111.

The resist 200 has a protrusion 201. The protrusion 201 protrudes from the upper surface 73b of the cover layer 73. The resist 200 may be partially provided in the exposure hole 121 and partially provided on the upper surface 73b as illustrated in the example of FIG. 7, or, alternatively, may be provided simply on the upper surface 73b.

The protrusion 201 is located between the pad 81 and the pad 83 and between the pad 81 and the pad 84 in the direction along the upper surface 71a of the base layer 71. The protrusion 111 is located also between the underfill 69 and the pad 83 and between the underfill 69 and the pad 84.

The protrusion 201 has two side surfaces 201a and 201b. The side surface 201a is an example of the first, protruding surface and the protruding surface. The side surfaces 201a and 201b protrude (stick out, rise) from the upper surface 73b, and face in the direction intersecting the direction in which the upper surface 73b faces.

The side surface 201a is closer to the pad 83 than the side surface 201b, and is closer to the pad 84 than the side surface 201b. The side surface 201b is located on the opposite side of the side surface 201a. The side surface 201b is closer to the pad 81 than the side surface 201a. In a case where the flux F flows out of the solder 95, the flux F is blocked by the side surface 201a of the protrusion 201.

The through hole 125 is located between the side surface 201a of the protrusion 201 and the exposure hole 123 in the direction along the upper surface 71a of the base layer 71. Further, the through hole 125 is located in the vicinity of an end of the side surface 201a in a direction in which the side surface 201a of the protrusion 201 extends.

As described above, the protrusions 111 and 201 can be provided in various modes. For example, as described in the first embodiment, the protrusion 111 and the side surfaces 111a and 111b may be provided by raising a part of the cover layer 73 due to the presence of a part of the conductive layer 72 such as the ground wiring 91. Alternatively, as described in the second embodiment, the protrusion 201 and the side surfaces 201a and 201b may be provided by placing another member such as the resist 200 on the upper surface 73b of the cover layer 73.

Third Embodiment

Figure 8:
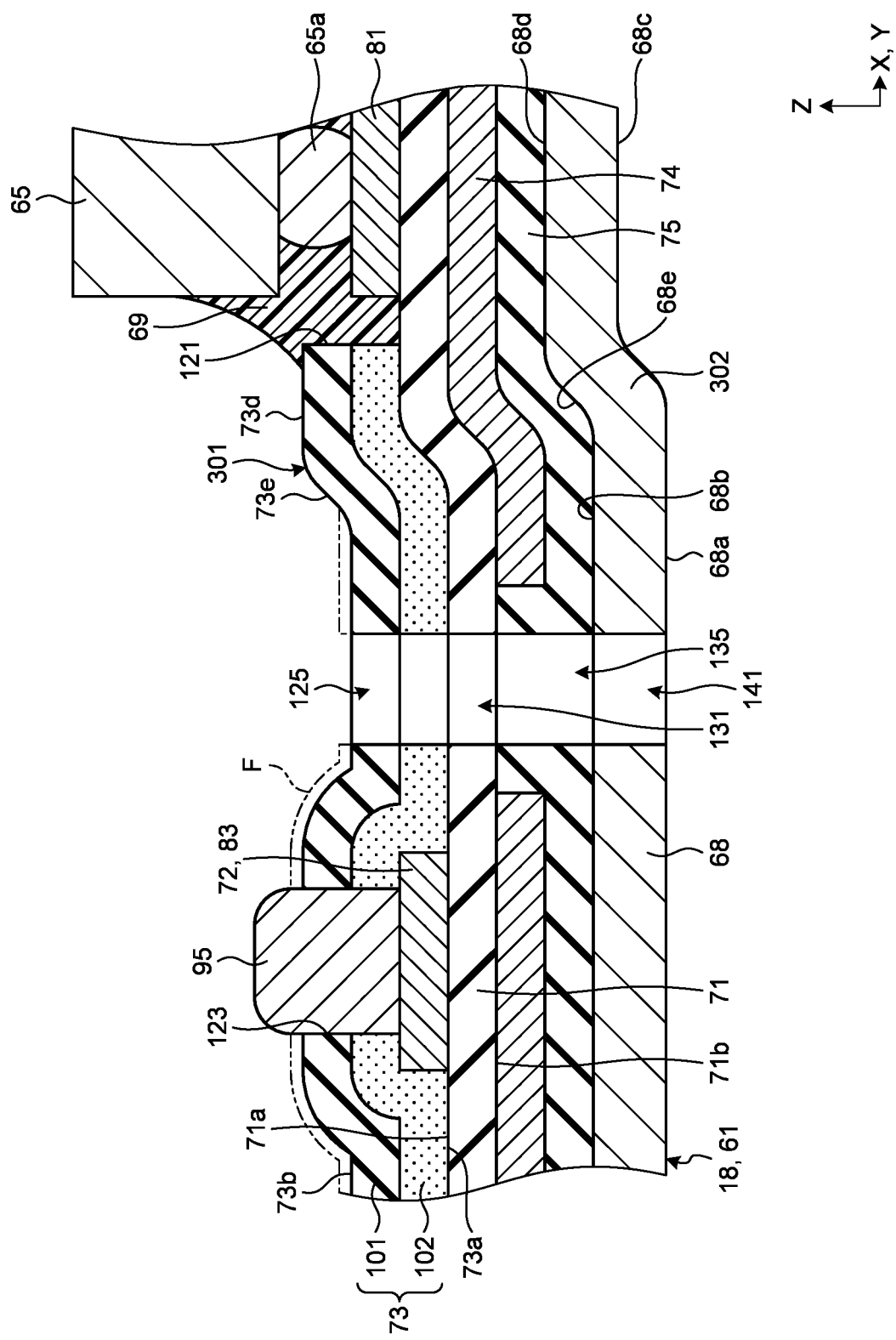
FIG. 8 is an exemplary cross-sectional view illustrating a part of a first connection part according to a third embodiment.

Hereinafter, the third embodiment is described with reference to FIG. 8. FIG. 8 is an exemplary cross-sectional view illustrating a part of the first connection part 61 according to the third embodiment. As illustrated in FIG. 8, the FPC 18 of the third embodiment includes a bent part 301 instead of the ground wiring 91 and the protrusion 111. The bent part 301 is a bent part of the FPC 18.

In the third embodiment, the reinforcing plate 68 has a bent part 302. The bent part 302 is a part of the reinforcing plate 68 bent by press working, for example. Further, the reinforcing plate 68 has a lower surface 68a, an upper surface 68b, a stepwise lower surface 68c, a stepwise upper surface 68d, and a slope 68e. The upper surface 68b is an example of a fifth surface. The slope 68e is an example of a second protruding surface.

The lower surface 68a and the stepwise lower surface 68c are surfaces of the reinforcing plate 68 facing the −Z-direction. The lower surface 68a and the stepwise lower surface 68c are disposed substantially parallel to each other. The stepwise lower surface 68c is spaced, by Z, from the lower surface 68a in the Z-direction.

The upper surface 68b and the stepwise upper surface 68d are surfaces of the reinforcing plate 68 facing the Z-direction. The upper surface 68b and the stepwise upper surface 68d face the lower surface 71b of the base layer 71. The upper surface 68b is located on the opposite side of the lower surface 68a. The stepwise upper surface 68d is located on the opposite side of the stepwise lower surface 68c. The upper surface 68b and the stepwise upper surface 68d are disposed substantially parallel to each other. The stepwise upper surface 68d is spaced, by f Z, from the upper surface 68b in the Z-direction.

The bent part 302 is provided between the lower surface 68a and the stepwise lower surface 68c and between the upper surface 68b and the stepwise upper surface 68d. Stated differently, the bent part 302 bends the reinforcing plate 68 in a step shape such that the lower surface 68a and the stepwise lower surface 68c are distinguished and the upper surface 68b and the stepwise upper surface 68d are distinguished. Note that the reinforcing plate 68 is not limited to the example.

The slope 68e is provided in the bent part 302 and is located between the upper surface 68b and the stepwise upper surface 68d. The slope 68e extends diagonally with respect to the upper surface 68b and the stepwise upper surface 68d between the upper surface 68b and the stepwise upper surface 68d. The slope 68e may extend so as to be orthogonal to the upper surface 68b and the stepwise upper surface 68d.

The slope 68e protrudes (sticks out, rises) from the upper surface 68b along the bent part 302, and faces in a direction intersecting the direction in which the upper surface 68b faces. The bent part 302 and the slope 68e are located between the pad 81 and the pad 83 and between the pad 81 and the pad 84 in the direction along the upper surface 71a of the base layer 71.

The cover layer 73 further includes a stepwise upper surface 73d and a slope 73e. The slope 73e is an example of the first protruding surface. The stepwise upper surface 73d is disposed substantially parallel to the upper surface 73b. The stepwise upper surface 73d is spaced, by +Z direction, from the upper surface 73b in the Z-direction. In the third embodiment, the exposure hole 121 is open to the stepwise upper surface 73d. On the other hand, the exposure hole 123 is open to the upper surface 73b.

The bent part 301 is provided between the upper surface 73b and the stepwise upper surface 73d. Stated differently, the bent part 301 bends the FPC 18 in a step shape such that the upper surface 73b and the stepwise upper surface 73d are distinguished. Note that the FPC 18 is not limited to the example.

The slope 73e is provided in the bent part 301 and is located between the upper surface 73b and the stepwise upper surface 73d. The slope 73e extends diagonally with respect to the upper surface 73b and the stepwise upper surface 73d between the upper surface 73b and the stepwise upper surface 73d. The slope 73e may extend so as to be orthogonal to the upper surface 73b and the stepwise upper surface 73d.

The bent part 301 of the FPC 18 is formed by attaching the FPC 18 to the reinforcing plate 68 having the bent part 302. The bent part 301 of the FPC 18 is thus provided along the bent part 302 of the reinforcing plate 68.

The slope 73e protrudes (sticks out, rises) from the upper surface 73b along the bent parts 301 and 302, and faces in a direction intersecting the direction in which the upper surface 73b faces. In other words, the slope 73e protrudes from the upper surface 73b along the slope 68e of the reinforcing plate 68.

The bent part 301 and the slope 73e are located between the pad 81 and the pad 83 and between the pad 81 and the pad 84 in the direction along the upper surface 71a of the base layer 71. Further, the bent part 301 and the slope 73e are located also between the underfill 69 and the pad 83 and between the underfill 69 and the pad 84. In a case where the flux F flows out of the solder 95, the flux F is blocked by the slope 73e.

In the HDD 10 of the third embodiment described above, the reinforcing plate 68 has rigidity higher than the base layer 71 and is attached to the FPC 18. The reinforcing plate 68 has the upper surface 68b facing the FPC 18 and the slope 68e protruding from the upper surface 68b. The slope 73e protrudes from the upper surface 73b along the slope 68e. The slope 73e can be included in the cover layer 73, for example, by attaching the FPC 18 to the upper surface 68b having the slope 68e. This eliminates the need to add special steps for forming the slope 73e, leading to preventing cost increase in the HDD 10 of this embodiment.

In the embodiments described above, the preamplifier 65 is an example of the component; however, the relay connector 66, the sensor 67, or another component may be an example of the component. The protrusions 111, 112, and 113 and the through holes 125, 126, and 127 are provided in the first connection part 61; however, they may be provided in another part such as the second connection part 62.

In the above description, the prevention/reduction is defined as, for example, preventing the occurrence of an event, an action, or an influence, or reducing the degree of the event, the action, or the influence. Further, in the above description, the limit/restriction is defined as, for example, preventing movement or rotation, or allowing movement or rotation within a predetermined range and preventing movement or rotation beyond the predetermined range.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A disk device comprising:
   a magnetic disk;
   a magnetic head configured to read and write information from and to the magnetic disk;
   a flexible printed circuit board electrically connected to the magnetic head, the flexible printed circuit board including:
      a first layer including a first surface having insulation property,
      a second layer overlaying the first surface and having conductive property, the second layer including a first conductor and a second conductor spaced from the first conductor, and
      a third layer having insulation property and covering at least a part of the first surface and at least a part of the second layer,
      the flexible printed circuit board provided with a first hole that is located between the first conductor and the second conductor with spacing from the second layer and penetrates the third layer;
   a component connected to the first conductor;
   an underfill extending between the component and the flexible printed circuit board; and
   solder attached to the second conductor, wherein
   the first hole is located between the underfill and the solder,
   the third layer with a second hole exposing the second conductor includes
      a second surface facing the first surface, and
      a third surface opposite the second surface and to which the second hole is open, and
   the flexible printed circuit board includes a first protruding surface between the first conductor and the second conductor in a direction along the first surface, the first protruding surface protruding from the third surface.

2. The disk device according to claim 1, wherein the first hole is located between the first protruding surface and the second hole in the direction along the first surface.

3. The disk device according to claim 1, wherein
   the second layer includes ground wiring that is located between the first conductor and the second conductor and is electrically connected to a ground, and
   the first protruding surface protrudes from the third surface along the ground wiring.

4. The disk device according to claim 1, wherein the first hole is located adjacent to an end of the first protruding surface in a direction in which the first protruding surface extends.

5. The disk device according to claim 1, further comprising:
   a wall having rigidity higher than the first layer and attached to the flexible printed circuit board, wherein
   the wall has a fifth surface facing the flexible printed circuit board and a second protruding surface protruding from the fifth surface, and
   the first protruding surface protrudes from the third surface along the second protruding surface.

6. The disk device according to claim 1, wherein
   the first conductor includes first wiring extending along the first surface,
   the second conductor includes second wiring extending along the first wiring, and
   the third layer covers the first wiring and the second wiring.

7. A disk device comprising:
   a magnetic disk;
   a magnetic head configured to read and write information from and to the magnetic disk;
   a flexible printed circuit board electrically connected to the magnetic head, the flexible printed circuit board including:
      a first layer including a first surface having insulation property,
      a second layer overlaying the first surface and having conductive property, the second layer including a first conductor and a second conductor spaced from the first conductor, and
      a third layer having insulation property and covering at least a part of the first surface and at least a part of the second layer,
      the flexible printed circuit board provided with a first hole that is located between the first conductor and the second conductor with spacing from the second layer and penetrates the third layer;

a wall having rigidity higher than the first layer and attached to the flexible printed circuit board, wherein the first layer is provided with a third hole located between the third layer and the wall, the third hole penetrating the first layer to communicate with the first hole, and the wall is provided with a fourth hole penetrating the wall to communicate with the third hole.

\* \* \* \* \*